(12) United States Patent
Marzaki et al.

(10) Patent No.: US 12,125,913 B2
(45) Date of Patent: Oct. 22, 2024

(54) TRIPLE-GATE MOS TRANSISTOR AND METHOD FOR MANUFACTURING SUCH A TRANSISTOR

(71) Applicant: STMicroelectronicsa (Rousset) SAS, Rousset (FR)

(72) Inventors: Abderrezak Marzaki, Aix en Provence (IT); Romeric Gay, Aix-en-Provence (FR)

(73) Assignee: STMicroelectronicsa (Rousset) SAS, Rousset (FR)

( * ) Notice: Subject to any disclaimer, the term of this patent is extended or adjusted under 35 U.S.C. 154(b) by 86 days.

(21) Appl. No.: 17/487,470

(22) Filed: Sep. 28, 2021

(65) Prior Publication Data

US 2022/0102556 A1     Mar. 31, 2022

(30) Foreign Application Priority Data

Sep. 30, 2020 (FR) ..................... 2009976

(51) Int. Cl.
*H01L 29/78* (2006.01)
*H01L 21/28* (2006.01)
(Continued)

(52) U.S. Cl.
CPC .... *H01L 29/7855* (2013.01); *H01L 29/40114* (2019.08); *H01L 29/42336* (2013.01);
(Continued)

(58) Field of Classification Search
CPC ............. H01L 29/66795; H01L 29/785; H01L 29/78696
See application file for complete search history.

(56) References Cited

U.S. PATENT DOCUMENTS

2008/0149984 A1    6/2008  Chang et al.
2008/0318375 A1    12/2008 Van Noort et al.
(Continued)

FOREIGN PATENT DOCUMENTS

CN    107123673 A    9/2017
CN    109698119 A    4/2019
(Continued)

OTHER PUBLICATIONS

INPI Search Report and Written Opinion for FR Appl. No. 2009976 dated May 19, 2021 (9 pages).
(Continued)

*Primary Examiner* — Xiaoming Liu
(74) *Attorney, Agent, or Firm* — Crowe & Dunlevy LLC

(57) ABSTRACT

A triple-gate MOS transistor is manufactured in a semiconductor substrate including at least one active region laterally surrounded by electrically isolating regions. Trenches are etched on either side of an area of the active region configured to form a channel for the transistor. An electrically isolating layer is deposited on an internal surface of each of the trenches. Each of the trenches is then filled with a semiconductive or electrically conductive material up to an upper surface of the active region so as to form respective vertical gates on opposite sides of the channel. An electrically isolating layer is then deposited on the upper surface of the area of the active region at the channel of the transistor. At least one semiconductive or electrically conductive material then deposited on the electrically isolating layer formed at the upper surface of the active region to form a horizontal gate of the transistor.

17 Claims, 10 Drawing Sheets

(51) Int. Cl.
    *H01L 29/423*     (2006.01)
    *H01L 29/66*     (2006.01)
    *H01L 29/788*     (2006.01)
    *H10B 41/35*     (2023.01)
    *H01L 27/088*     (2006.01)

(52) U.S. Cl.
    CPC .. *H01L 29/66795* (2013.01); *H01L 29/66825* (2013.01); *H01L 29/7889* (2013.01); *H10B 41/35* (2023.02); *H01L 27/0886* (2013.01)

(56) References Cited

U.S. PATENT DOCUMENTS

| | | | |
|---|---|---|---|
| 2013/0043544 A1* | 2/2013 | Erickson | H01L 27/0886 |
| | | | 257/E27.06 |
| 2014/0191291 A1 | 7/2014 | La Rosa et al. | |
| 2014/0264444 A1* | 9/2014 | Guo | H01L 29/78 |
| | | | 438/296 |
| 2019/0067274 A1* | 2/2019 | Marzaki | H01L 29/7827 |

FOREIGN PATENT DOCUMENTS

| | | | |
|---|---|---|---|
| CN | 106206689 B | 7/2019 | |
| CN | 216871979 U | 7/2022 | |
| EP | 1852909 A1 | 11/2007 | |
| WO | 2006079964 A2 | 8/2006 | |
| WO | 2014201746 A1 | 12/2014 | |

OTHER PUBLICATIONS

CN First Office Action and Search Report for counterpart CN Appl. No. 202111154062.4, report dated Aug. 6, 2024, 13 pgs.

\* cited by examiner

TRIPLE-GATE MOS TRANSISTOR AND METHOD FOR MANUFACTURING SUCH A TRANSISTOR

PRIORITY CLAIM

This application claims the priority benefit of French Application for Patent No. 2009976, filed on Sep. 30, 2020, the content of which is hereby incorporated by reference in its entirety to the maximum extent allowable by law.

TECHNICAL FIELD

Embodiments herein concern a triple-gate MOS transistor and a method for manufacturing such a transistor.

BACKGROUND

In order to reduce the size of transistors, it is known to replace planar structures with non-planar structures. In these non-planar structures, such as MOS transistors of Fin Field-Effect Transistor (FinFET) type, the source, the drain and the channel of a MOS transistor are arranged in an active region in the form of a fin made of a semi-conductor material in relief from the surface of a substrate of said semi-conductor material. The source and the drain are two doped regions of the fin, distant from each other.

The length of the channel is defined as being the distance between the source and the drain.

In such a transistor, short channel effects particularly occur.

In order to reduce these effects and better control the channel, it is known to form the gate of the transistor on the three faces of the region of the fin forming the channel. This is then referred to as triple-gate transistor.

FIG. 1 schematically illustrates a triple-gate MOS transistor of the FinFET type.

This transistor is formed on a silicon substrate 1' comprising at least one active region 10' in the form of a fin in relief from (i.e., extending above) the main surface of the substrate 1' and surrounded by isolation regions 2' formed of one or several electrically isolating material(s), such as silicon oxide ($SiO_2$) and/or silicon nitride ($Si_3N_4$).

In the case of a fully depleted transistor, the width of the fin (that is to say the distance between its two main vertical faces) is on the order of about ten nanometers.

The source S' and the drain D' are arranged in two opposite regions of the fin, having a doping of a type opposite to that of the substrate 1'.

The channel C' is arranged in the fin 10' between the source S' and the drain D'.

To better control the channel, the channel is surrounded by the gate G' on its two vertical faces and its upper horizontal face: this transistor is therefore referred to as a triple-gate transistor.

FIGS. 2A to 2C schematically illustrate a method for forming said transistor.

Referring to FIG. 2A, a silicon substrate 1' is formed comprising a plurality of fins 10' separated by electrically isolating regions 2'.

Referring to FIG. 2B, a surface portion of the two regions surrounding a fin is etched, so as to partially expose the lateral faces of said fin. Said exposed faces extend in relief from the surface 20', 21' of the electrically isolating regions after etching.

Referring to FIG. 2C, an electrically isolating material, for example silicon oxide, is formed on the exposed faces of the fin, to form a gate oxide on the three faces of the region of the fin forming the channel up to the surface 20', 21' of the electrically isolating regions, then a gate material, for example polycrystalline silicon, is deposited on the gate oxide. This forms the gate structure G'.

In addition, dopants are introduced into the two regions of the fin arranged on either side of the channel to form the source and the drain.

In so far as the gate extends continuously over all three faces of the channel, the gate can be polarized (i.e., biased) by a single electric potential applied by a gate electrode.

It remains desirable to further improve the performances of MOS transistors without increasing the surface imprint or the manufacturing cost. Furthermore, in some applications, it is desirable to facilitate the integration of the MOS transistors with other electronic components such as memory cells.

SUMMARY

In an embodiment, a method for manufacturing a triple-gate MOS transistor, comprises: providing a semi-conductor substrate comprising at least one active region laterally surrounded by electrically isolating regions; etching trenches on either side of an area of said active region configured to form a channel from the transistor to the substrate; forming an electrically isolating layer on the internal surface of each of said trenches; filling each trench with a semi-conductor or electrically conductor material up to an upper surface of the active region, so as to form a respective vertical gate; forming an electrically isolating layer on the upper surface of the area of the active region configured to form the channel of the transistor; and depositing at least one semi-conductor or electrically conductor material on the electrically isolating layer formed on the upper surface of the active region, so as to form a horizontal gate.

In a particularly advantageous manner, the horizontal gate is electrically isolated from the two vertical gates.

In some embodiments, the electrically isolating layer is a silicon oxide ($SiO_2$) layer.

In some embodiments, the semi-conductor material forming each gate is polycrystalline silicon.

In some embodiments, the method further comprises the doping of regions of the active region arranged on either side of the channel to form a source and a drain of the transistor.

In some embodiments, the formation of the horizontal gate comprises the successive deposition of a first polycrystalline silicon layer, of an oxide-nitride-oxide stack and of a second polycrystalline silicon layer.

In some embodiments, the method comprises the formation of a non-volatile memory cell comprising a vertical gate transistor in the substrate, in which said vertical gate is formed by etching of a trench in an active region of the substrate, formation of an electrically isolating layer on the internal surface of each of said trenches and filling of said trench with a semi-conductor or electrically conductor material up to an upper surface of the active region, each of said etching, formation and filling steps being implemented simultaneously with a respective etching, formation and filling step to form each vertical gate of the triple-gate MOS transistor.

An embodiment herein further concerns a triple-gate MOS transistor, which may be obtained by the method described above, comprising: a source, a drain and a channel extending between the source and the drain, arranged in an active region of a semi-conductor substrate, in which the channel is surrounded on three sides by two vertical gates and a horizontal gate electrically isolated from each other.

In some embodiments, each gate comprises a semi-conductor or electrically conductor gate material surrounded by an electrically isolating layer.

Another embodiment concerns an integrated circuit comprising a semi-conductor substrate in which are arranged: a non-volatile memory cell comprising a vertical gate transistor and a triple-gate MOS transistor as described above.

BRIEF DESCRIPTION OF THE DRAWINGS

Other characteristics and advantages will emerge from the following detailed description with reference to the appended drawings, in which.

Only the elements necessary for understanding the figures were illustrated.

For reasons of readability of the figures, these elements were not necessarily represented to scale.

Reference signs identical from one figure to the other designate elements identical or fulfilling the same function; they are therefore not necessarily described in detail for each figure.

DETAILED DESCRIPTION

In the present text, the terms "on", "under", "vertical", "horizontal", "upper", "lower", "lateral", etc. are understood in relation to the position and orientation of the elements considered in the figures. Particularly, the main surface of the substrate is considered to be horizontal, the thickness of the substrate extending in the vertical direction.

Figure 1:
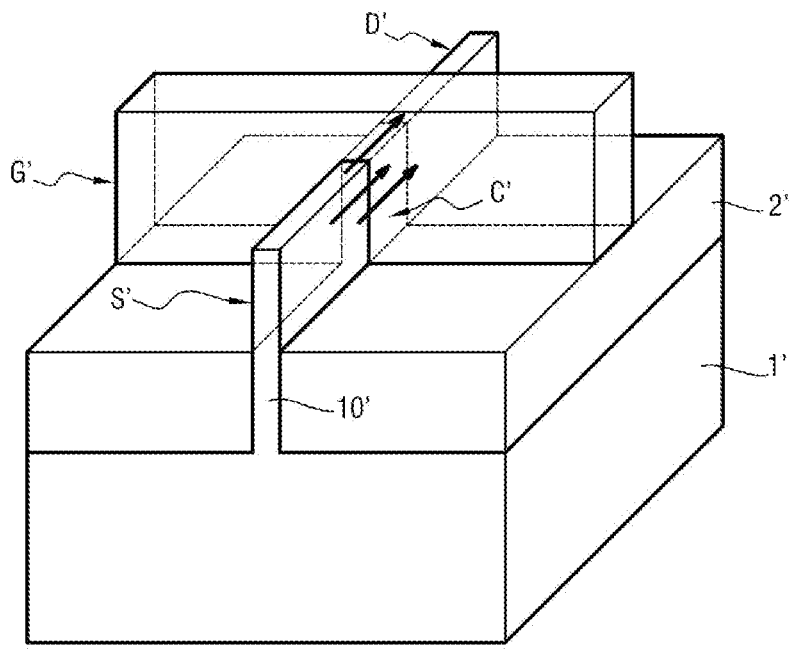
FIG. 1 is a block diagram of a triple-gate MOS transistor according to the state of the art.
Figure 2A:
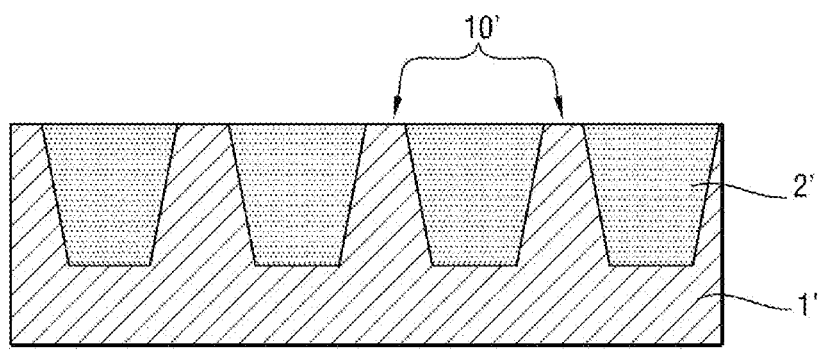
FIG. 2A is a block diagram of a first step of manufacturing the transistor in FIG. 1.
Figure 2B:
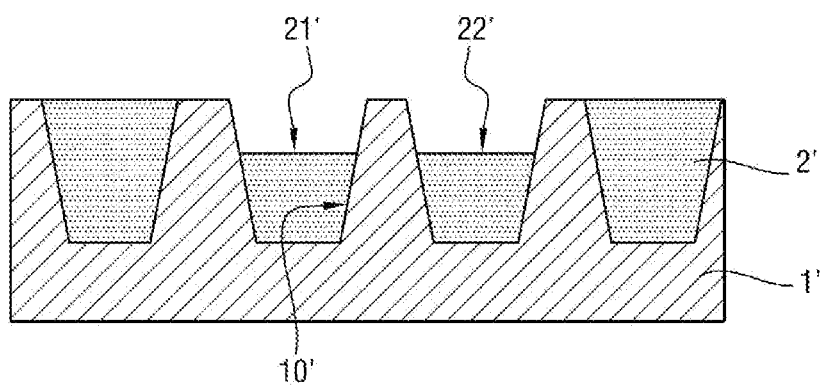
FIG. 2B is a block diagram of a second step of manufacturing the transistor in FIG. 1.
Figure 2C:
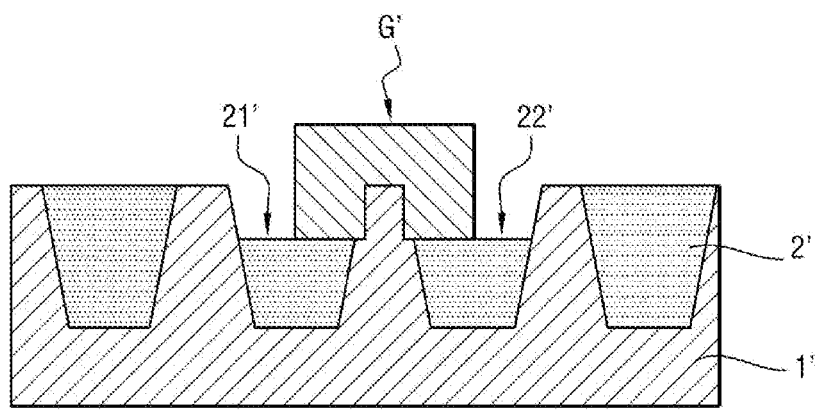
FIG. 2C is a block diagram of a third step of manufacturing the transistor in FIG. 1.
Figure 3:
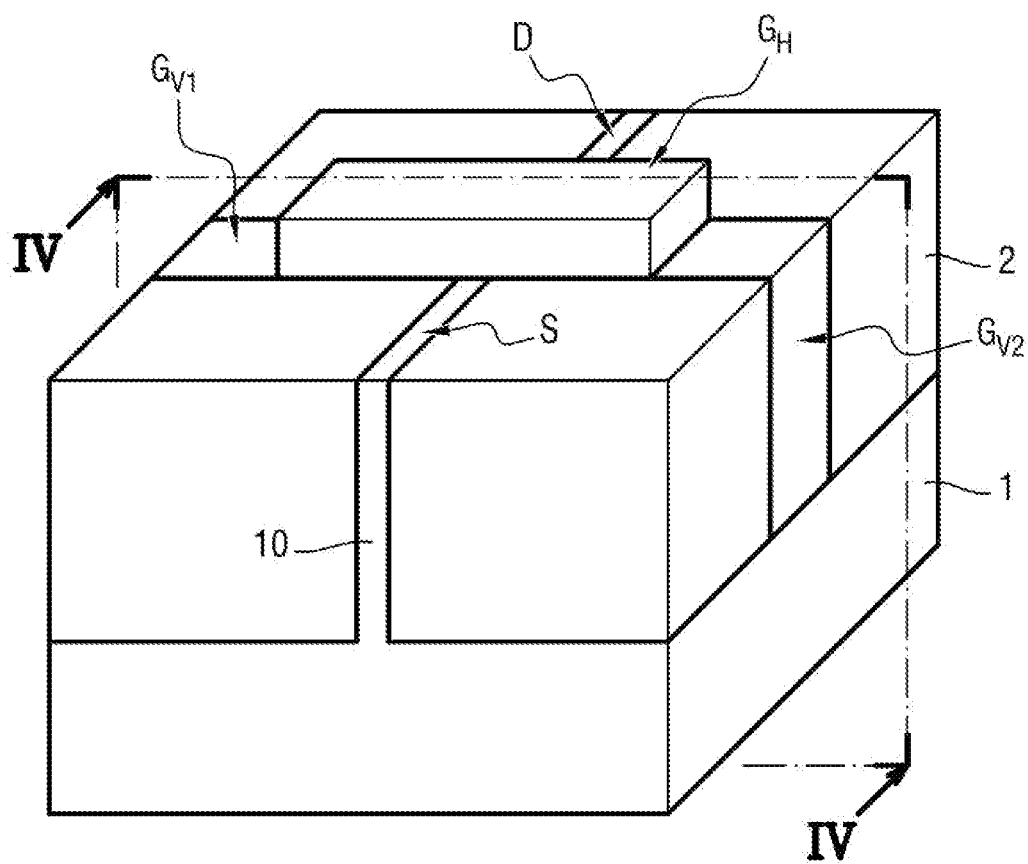
FIG. 3 is a block diagram of a triple-gate transistor.

FIG. 3 schematically illustrates a triple-gate transistor.

Said transistor is formed in a semi-conductor substrate 1, for example a silicon substrate. The substrate 1 can be doped, typically P-type doped.

The source S and the drain D of the transistor are formed in an active region 10 formed in said substrate. Said active region is surrounded by an electrically isolating material 2, such as silicon oxide ($SiO_2$) and/or silicon nitride ($Si_3N_4$) for example.

The region forming the channel of the transistor is arranged in the fin between the source S and the drain D. The length of the channel is on the order of 200 nm.

Figure 4:
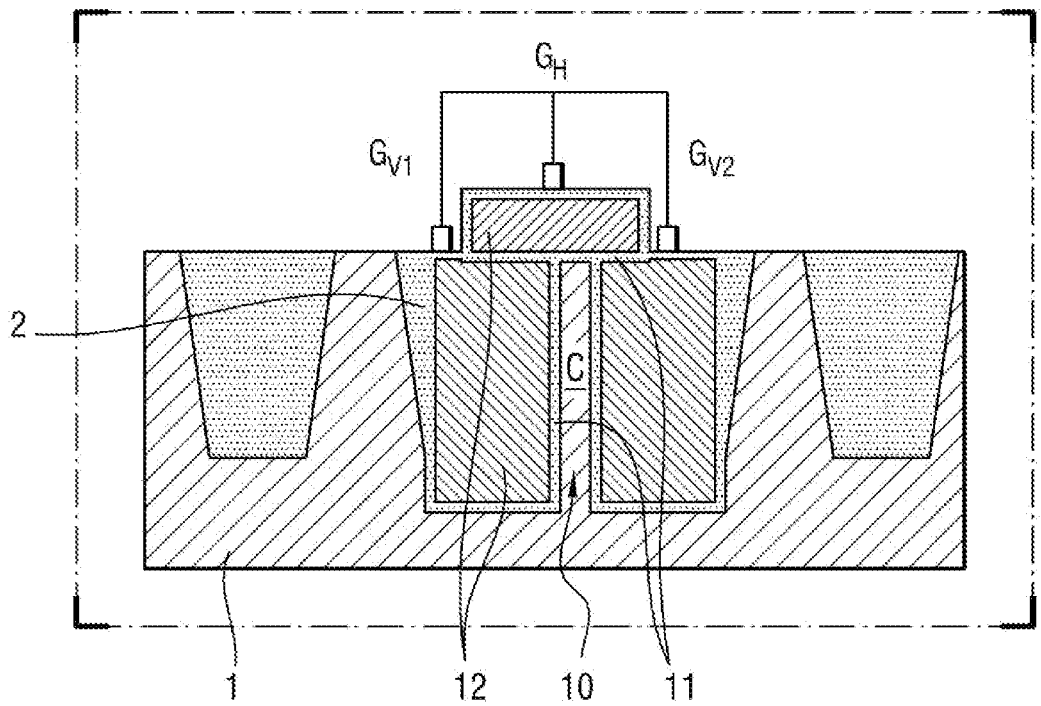
FIG. 4 is a block diagram in cross-section of the transistor in FIG. 3.

As better seen in FIG. 4, which is a sectional view in the plane of the dotted rectangle labeled IV in FIG. 3, the region forming the channel C is surrounded on three of its faces by a respective gate $G_{V1}$, $G_{V2}$ and $G_H$ by means of a gate oxide 11. Each vertical face is attached to a respective vertical gate $G_{V1}$, $G_{V2}$ surrounded by a gate oxide, while the upper horizontal face is covered with a horizontal gate $G_H$ surrounded by a gate oxide.

For the same surface imprint, the transistor in FIG. 4 benefits from a greater effective width, corresponding to the perimeter controlled by the gates, which is equal to the sum of the heights of the vertical gates $G_{V1}$, $G_{V2}$ and the width of the horizontal gate $G_H$.

Since the gates $G_{V1}$, $G_{V2}$ and $G_H$ are separate and electrically isolated from each other, they can each be connected to a separate electrode and controlled (for example, biased with a control voltage) independently of each other.

Figure 5:
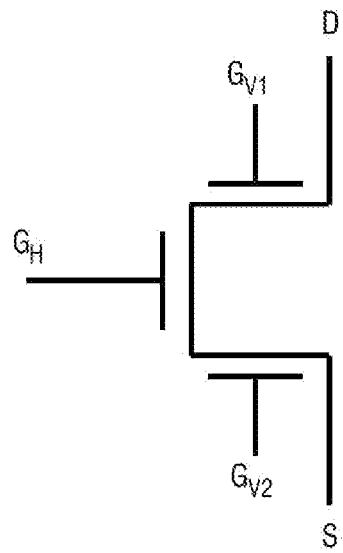
FIG. 5 is an electronic diagram of the transistor in FIG. 3.

This structure of the transistor is reflected in the electric diagram in FIG. 5.

Such a transistor could be formed by the method described with reference to FIGS. 6A to 6D.

Figure 6A:
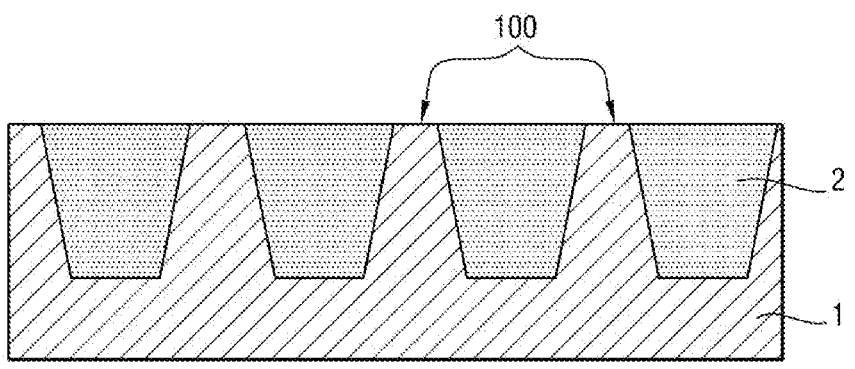
FIGS. 6A-6D show steps of a method of manufacturing the transistor in FIG. 3.

Referring to FIG. 6A, active regions 100 separated by electrically isolating regions 2 are formed in a semi-conductor substrate 1.

Figure 6B:
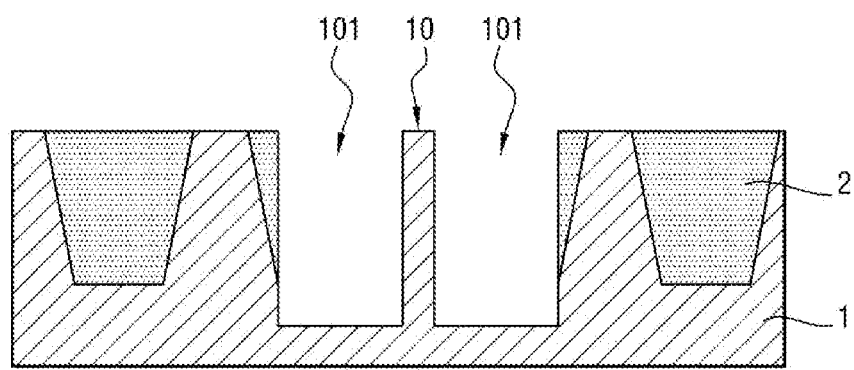

Referring to FIG. 6B, an active region 100 and each of the two adjacent regions 2 are vertically etched to form a trench 101 extending up to the main surface of the substrate 1. Said etching can be advantageously a dry etching, in particular a plasma-assisted etching.

At the end of this etching, the active region 10 has two parallel vertical faces. The width of the active region is typically on the order of a few hundred nanometers, for example about 200 nm, but it is possible to obtain a thinner active region by using an etching process adapted to control such a width.

Figure 6C:
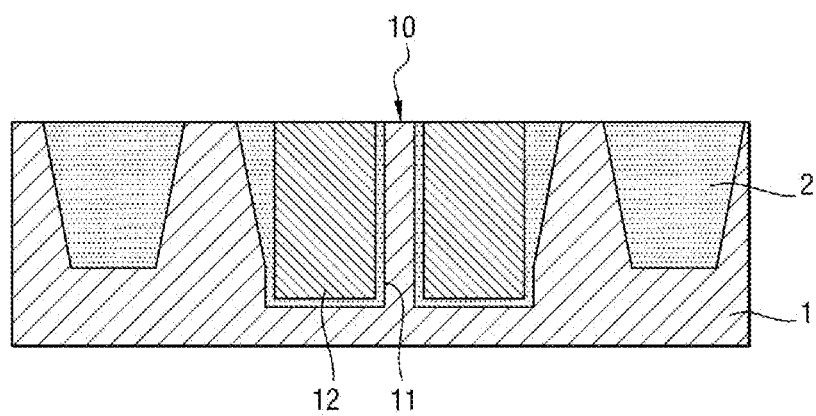

Referring to FIG. 6C, an electrically isolating layer 11 is then formed on the faces of each trench 101. The thickness of said electrically isolating layer is typically on the order of ten nanometers.

Then, each trench 101 is filled with a semi-conductive or electrically conductive material 12, constituting the gate material of the vertical gates $G_{V1}$, $G_{V2}$. This material can be, for example, polycrystalline silicon.

At the end of this step, the surface of the structure is polished, for example by a mechanical-chemical polishing (CMP).

Figure 6D:
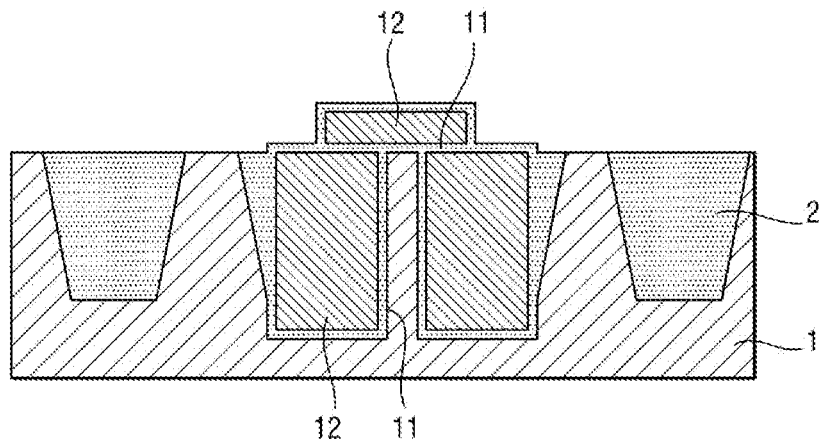

Referring to FIG. 6D, an electrically isolating layer 11 is formed on the upper face of the active region 10, then a semi-conductor or electrically conductor gate material 12 is deposited on said layer 11 to form the horizontal gate $G_H$. Said gate material may be identical to or different from the material used for the vertical gates $G_{V1}$, $G_{V2}$.

After the formation of said gates, dopant species are introduced into two opposite regions of the active region to form the source and the drain. Said species can be introduced, for example, by doping or by diffusion. Said dopant species are chosen to provide a doping of a type opposite to that of the substrate. Thus, if the substrate is made of slightly P-doped silicon, the source and the drain are N-type doped, for example with phosphorus.

Gate electrodes can then be formed on each of the gates $G_{V1}$, $G_{V2}$ and $G_H$ so as to allow the application of a potential to the horizontal gate on the one hand and to the vertical gates $G_{V1}$, $G_{V2}$ on the other hand. Thanks to the vertical gates, the threshold voltage of the transistor can then be modulated.

In some embodiments, the electric potential applied to the horizontal gate may be different from the potential applied to the vertical gates. The vertical gates can then allow modulating the threshold voltage of the MOS transistor.

In other applications, the electric potential applied to the horizontal gate may be identical to the potential applied to the vertical gates.

In some embodiments, an N-type doped isolation layer (called NISO) may be formed in the substrate 1 before the etching of the trenches 101. This layer implanted deep in the substrate allows delimiting therein a P-type doped well electrically isolated from the rest of the substrate. In this case, the trenches 101 are formed so as to extend up to the NISO layer, so that, when filling said trenches with the gate material, said gate material is in electrical contact with the material of the NISO layer. The source and the drain also being N-type doped regions, this arrangement of the vertical gates allows generating an electrical conduction mode across the thickness of the substrate. A vertical transistor is thus formed, in which a region of the NISO layer forms the source of the transistor, the N-doped region at the surface of the substrate forms the drain of the transistor, and the region of the substrate arranged between the source and the drain in the vicinity of the vertical gate forms the channel of the transistor.

This transistor architecture therefore allows forming three electric currents in the channel: a first horizontal electric current driven by the horizontal gate, a second horizontal electric current driven by the two vertical gates, and a vertical electric current also driven by the two vertical gates. In proportion, said electric currents have respectively about 20%, 60% and 20% of the total electric current flowing in the channel of the transistor.

Such a transistor can have applications in different types of circuits, in particular digital circuits, analog circuits, memories.

The manufacturing method described above is advantageous in that it uses technologies likely to be already implemented on the substrate on which the transistor is formed. Thus, the method can be easily integrated into existing industrial manufacturing lines and does not generate significant additional costs compared to the existing industrial methods.

Compared to a triple-gate FinFET transistor known from the state of the art, the triple-gate MOS transistor described above has, in the case where the horizontal gate is connected to the same electric potential as the two vertical gates, similar electrical performances, in particular a supplied electric current (noted Ion) three times greater than in a tunnel-effect transistor.

Moreover, whether the gates are connected or not to the same potential, the method for manufacturing the triple-gate transistor described above advantageously allows integration with other electronic devices in an integrated circuit formed in the same substrate.

Thus, in some embodiments, the MOS transistor can be integrated with an embedded non-volatile memory, in particular of the embedded shallow trench memory (eSTM) type. A method for manufacturing such a non-volatile memory, which comprises a vertical transistor, is described in particular in U.S. Pat. No. 9,012,961 (FR 3000838) incorporated herein by reference. As explained in said document, each memory cell comprises a floating gate transistor having a horizontal channel region and a selection transistor having a vertical channel region extending along a vertical gate electrically isolated from the substrate by a gate oxide layer.

The integration is reflected in the fact that at least part of the steps of manufacturing the triple-gate MOS transistor are common to the steps of manufacturing an embedded non-volatile memory. Particularly, mask-formation, implantation, etching and deposition steps, necessary for the manufacture of the triple-gate MOS transistor and of the memory cell, can be carried out simultaneously in different areas of the semi-conductor substrate. Thus, the gate of the vertical transistor of the eSTM memory cell can be manufactured according to the same method as the vertical gates of the MOS transistor. The manufacture of the triple-gate MOS transistor therefore requires no or few specific steps (such as the formation of the fin in the case of the FinFET transistor of the state of the art) likely to increase the manufacturing cost or time of the non-volatile memory.

Figure 7A:
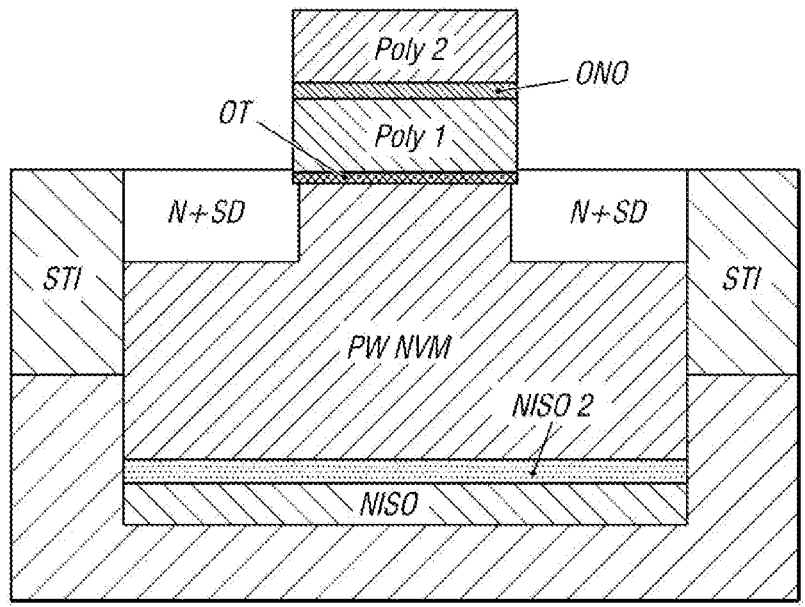
FIG. 7A illustrates a cross-sectional view across the length of the channel of a triple-gate MOS transistor in an environment of integration with a non-volatile memory.
Figure 7B:
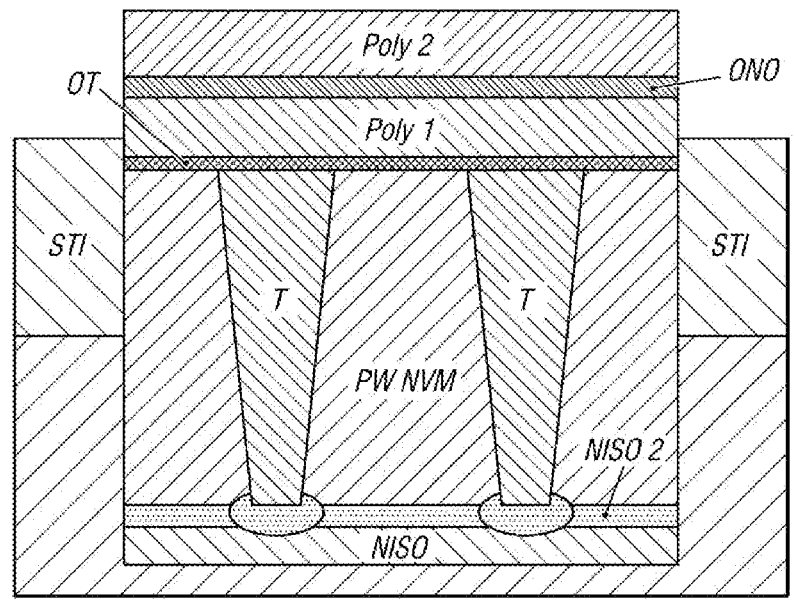
FIG. 7B illustrates a cross-sectional view across the width of the channel of the triple-gate MOS transistor in FIG. 7A.

FIGS. 7A and 7B illustrate one embodiment of a triple-gate MOS transistor as described above in an environment of integration with a non-volatile memory. FIG. 7A corresponds to a cross-section across the length of the horizontal channel while FIG. 7B corresponds to a cross-section across the width of the horizontal channel.

The triple-gate MOS transistor is formed in a semi-conductor substrate, for example a silicon substrate. In the illustrated embodiment, the substrate 1 is P-doped. In other embodiments (not illustrated), the substrate could be N-doped; in this case, the present description would remain applicable by reversing the dopings of the different regions.

The triple-gate MOS transistor is arranged in a P-doped well, noted PW NVM, which is delimited, across the width and the length of the substrate, by two isolation trenches STI extending vertically in the substrate 1 and, across the thickness of the substrate, by an N-doped NISO isolation layer. N-doped source and drain regions, noted N+SD, are arranged on the surface of the well, and are separated by a region intended to form the horizontal channel of the MOS transistor.

The horizontal gate of the MOS transistor is formed on a tunnel oxide (OT) layer, forming the gate oxide, arranged on the surface of the substrate 1 facing the region of the channel. Said gate successively comprises, from the tunnel oxide layer, a first polycrystalline silicon layer Poly1, a dielectric layer advantageously comprising a stack of nitride silicon and oxide layers, designated by the acronym ONO (oxide-nitride-oxide), and a second polycrystalline silicon layer Poly2.

The electrically conductive trenches T described above to form the vertical gates of the MOS transistor extend into the PW NVM well between the OT oxide layer and the NISO well. In a particularly advantageous manner, the electrically conductive material of the trenches is in electrical contact with a doped NISO2 region of the NISO layer.

FIGS. 8A to 8J illustrate a method for manufacturing the transistor of FIGS. 7A and 7B integrated into a non-volatile memory. In these figures, the upper diagram corresponds to a cross-section across the length of the horizontal channel while the lower diagram corresponds to a cross-section across the width of the horizontal channel.

Figure 8A:
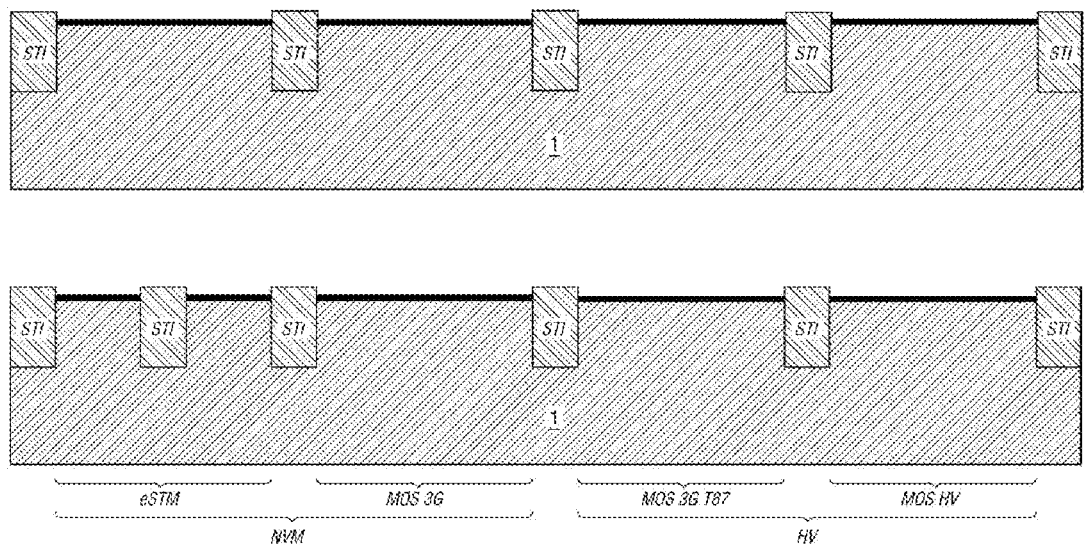
FIGS. 8A-8J illustrate steps of a method of manufacturing a device comprising the integration of the triple-gate MOS transistor and the non-volatile memory.

Referring to FIG. 8A, a plurality of isolation trenches STI (Shallow Trench Isolation) delimiting active areas of the substrate are formed in a P-doped semi-conductor substrate 1. The isolation trenches STI are formed by etching of the substrate 1 and filling with an electrically isolating material, such as silicon oxide ($SiO_2$).

These areas comprise in particular, from left to right, an area eSTM intended for the formation of a memory cell eSTM, a MOS 3G area intended for the formation of a first triple-gate MOS transistor, the two areas eSTM and MOS 3G belonging to a non-volatile memory NVM environment, a MOS 3G T87 area intended for the formation of a second triple-gate MOS transistor and a MOS HV area intended for the formation of a high-voltage MOS transistor, the two MOS 3G T87 and MOS HV areas belonging to a high-voltage HV environment. By "high voltage" is meant in the present text an electrical voltage greater than or equal to 5 V. Although an area is illustrated for each type of component, it goes without saying that several components of the same type can be formed simultaneously in respective areas of the substrate.

Figure 8B:
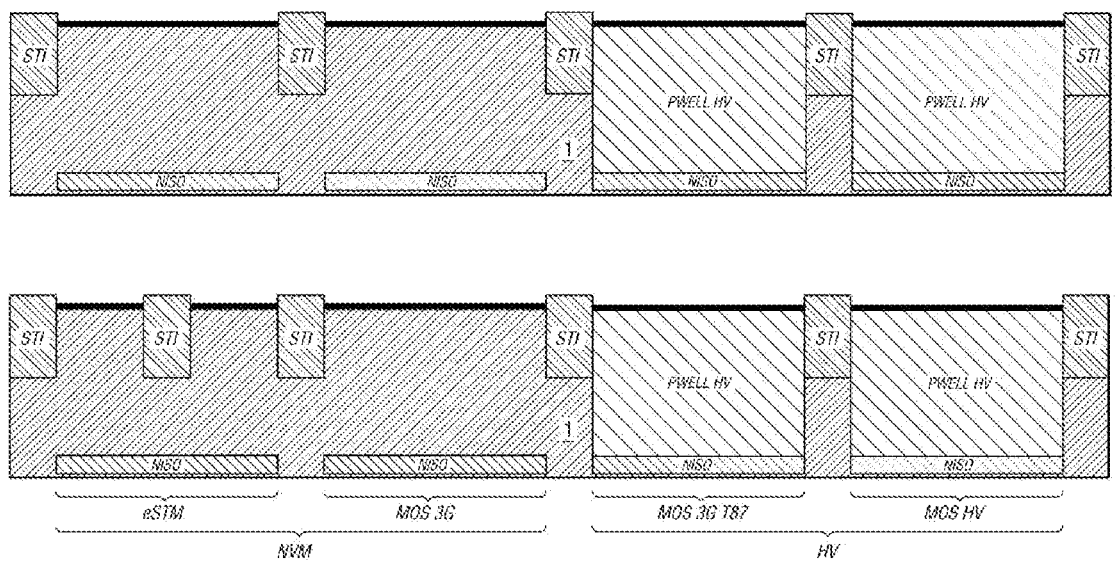

Referring to FIG. 8B, N-doped NISO isolation layers were formed in the substrate 1 so as to delimit P-doped wells within the thickness of the substrate. Moreover, between the surface of the substrate 1 and each respective NISO layer, two PWELL HV wells were P-type doped in the MOS 3G T87 and MOS HV areas.

Figure 8C:
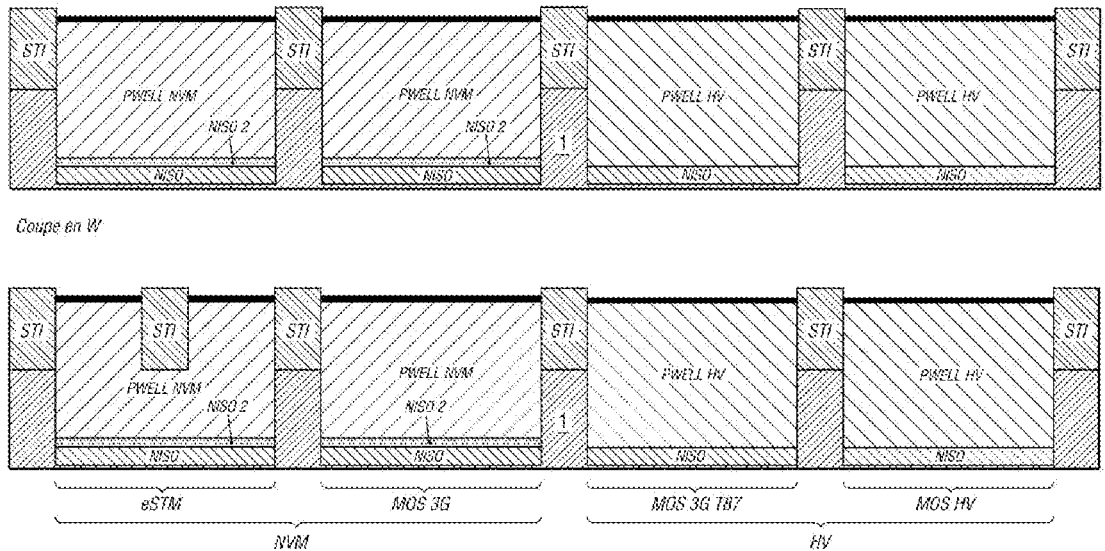

Referring to FIG. 8C, in the substrate 1, NISO2 isolation layers were formed on the NISO layers in the NVM environment. Furthermore, between the surface of the substrate 1 and each respective NISO2 layer, two PWELL NVM wells were P-type doped in the eSTM and MOS 3G areas. The doping of the wells is generally higher in the NVM non-volatile memory environment than in the high-voltage HV environment. Thus, the formation of the PWELL NVM wells requires more dopant implantation steps than that of the PWELL HV wells.

Figure 8D:
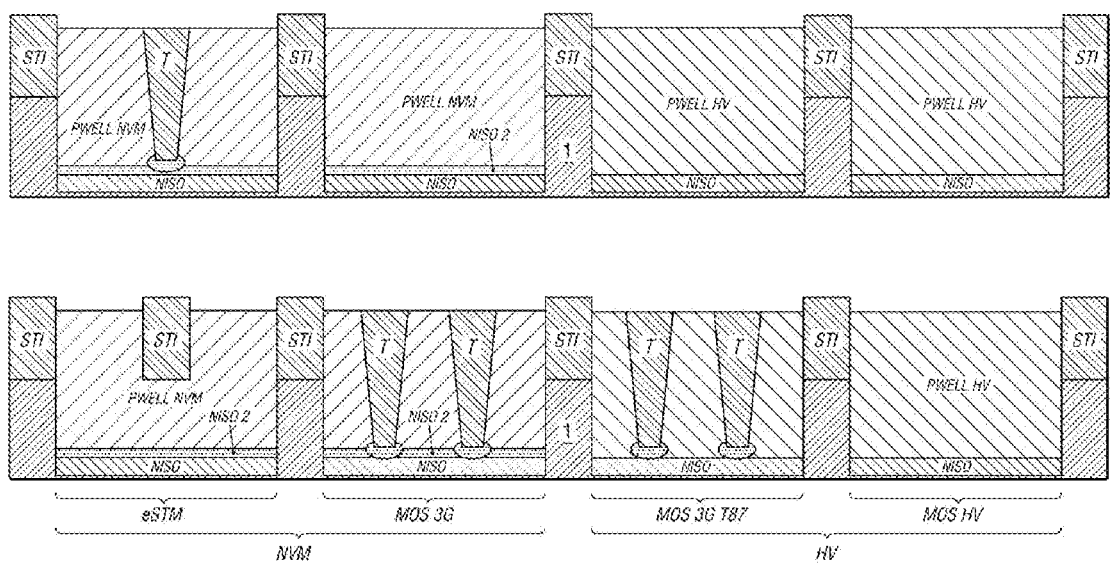

Referring to FIG. 8D, the electrically conductive trenches T described above are formed, both in the eSTM area and in the MOS 3G and MOS 3G T87 areas. As described above, the trenches T are formed by etching in the P-doped wells of the substrate 1 up to the respective NISO layer, deposition of the electrically isolating material forming the gate oxide and deposition of the electrically conductor material forming the gate. The NISO2 isolation layers allow establishing an electrical connection between each electrically conductor trench and the NISO isolation layer.

Figure 8E:
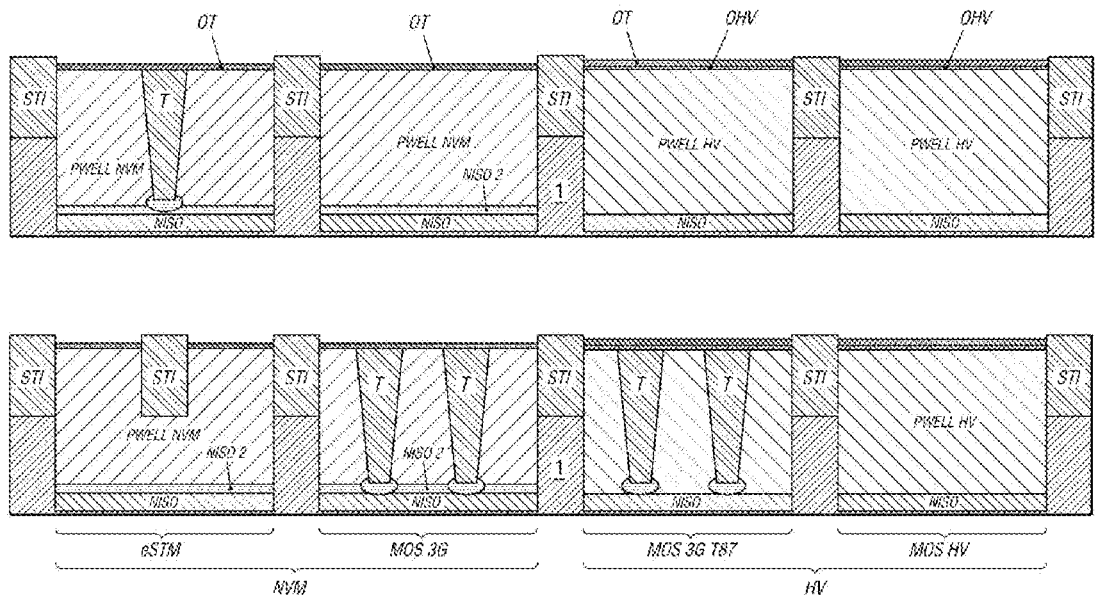

Referring to FIG. 8E, an OHV oxide layer is deposited on the surface of the substrate 1 on the PWELL HV wells, then an OT tunnel oxide layer is deposited on the surface of the substrate 1. Said OT tunnel oxide layer forms the gate oxide of the horizontal transistors of the memory cell and of the MOS transistors. The OHV layer has a greater thickness than that of the OT layer. For example, the thickness of the OHV layer may be on the order of 150 Å while the thickness of the OT layer may be on the order of 87 Å.

Figure 8F:
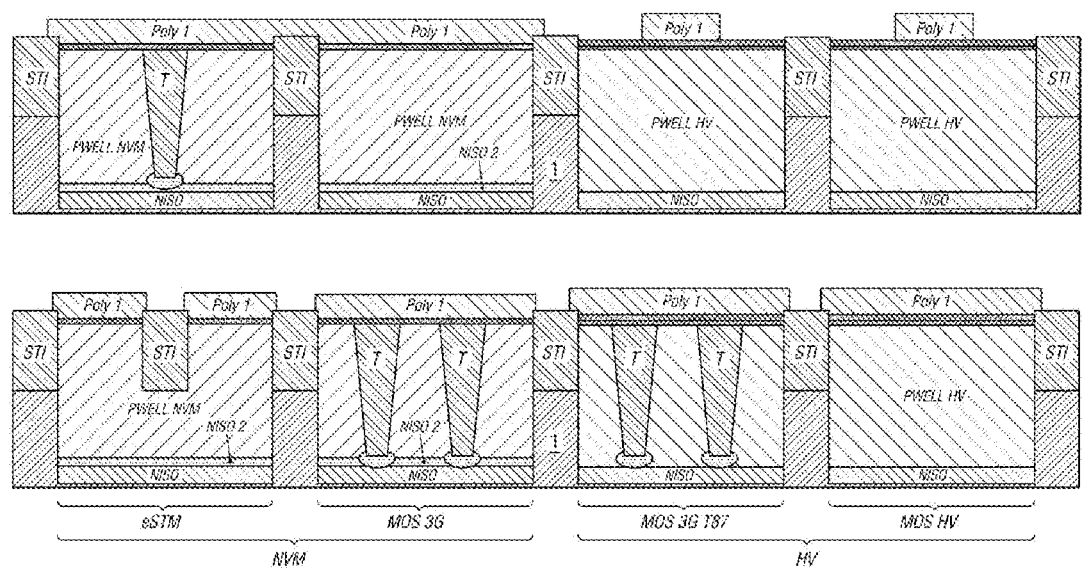

Referring to FIG. 8F, a first polycrystalline silicon layer Poly1 is deposited on the OT tunnel oxide layer and then part of the layer Poly1 is etched on the PWELL HV wells.

Figure 8G:
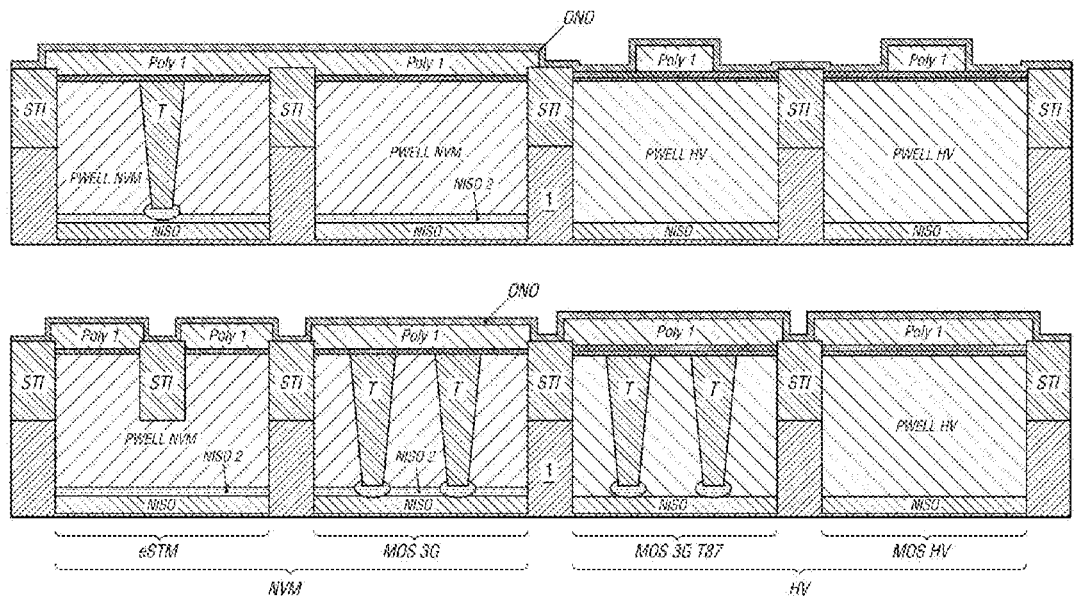

Referring to FIG. 8G, an ONO oxide-nitride-oxide layer is deposited on the entire surface of the substrate 1.

Figure 8H:
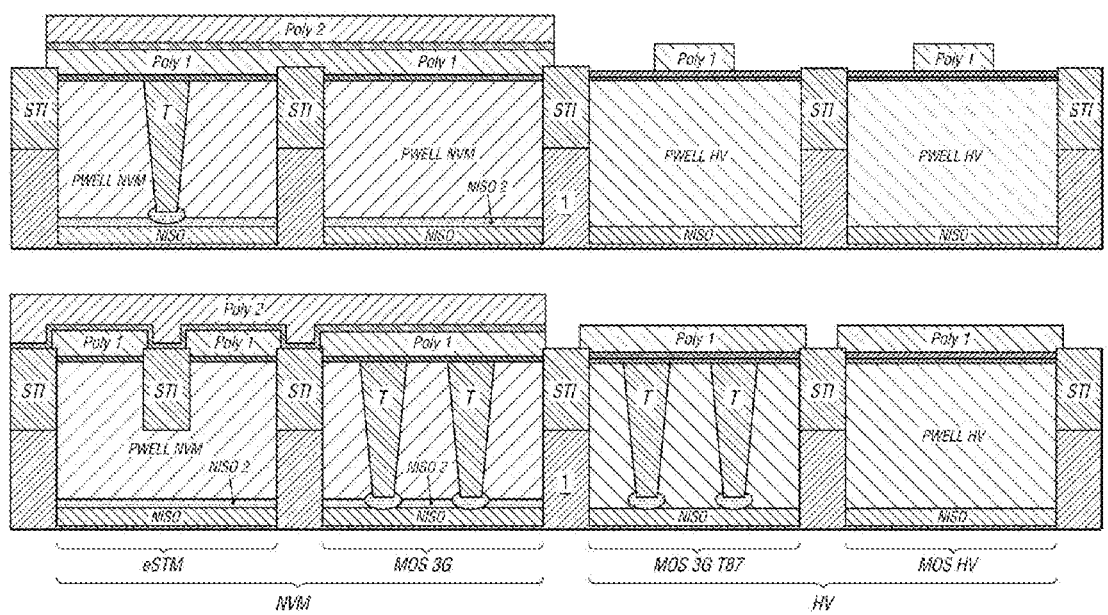

Referring to FIG. 8H, a second polycrystalline silicon layer Poly2 is deposited on the entire surface of the substrate and then said layer Poly2 as well as the ONO layer are etched on the HV environment.

Figure 8I:
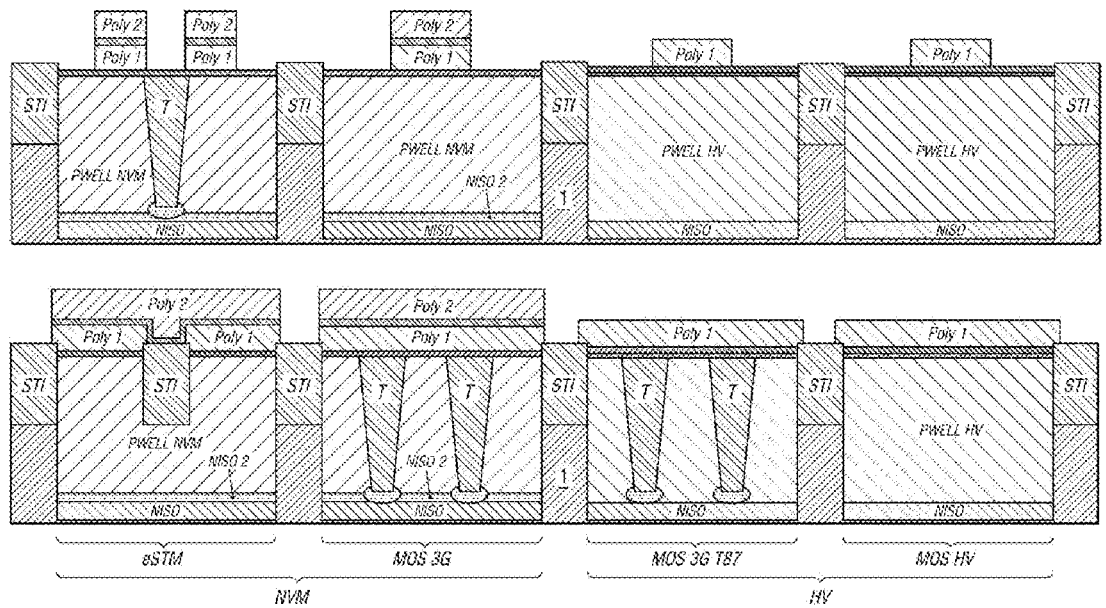

Referring to FIG. 8I, the stack Poly1/ONO/Poly2 is locally etched in the NVM environment, in order to delimit the gate of the eSTM cell and of the MOS 3G transistor.

Figure 8J:
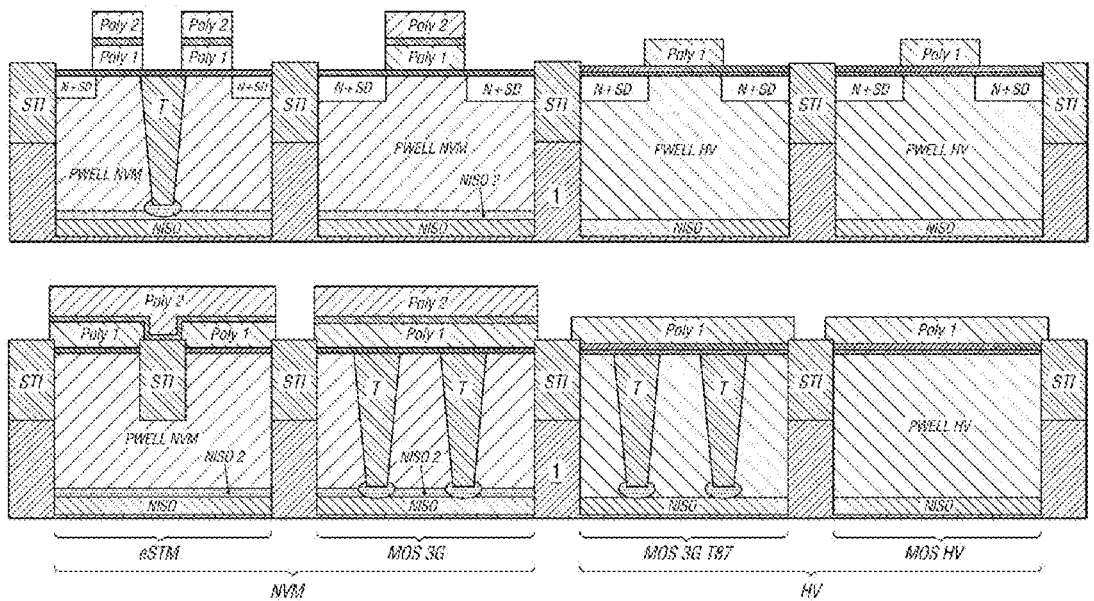

Referring to FIG. 8J, an implantation N+ was implemented to form the source and drain regions N+SD in all of the wells.

The invention claimed is:

1. A method for manufacturing both a triple-gate MOS transistor and a non-volatile memory cell, comprising:
   etching trenches on either side of an area of an active region in a semiconductor substrate that is laterally surrounded by electrically isolating regions in order to form a channel of the triple-gate MOS transistor in the semiconductor substrate;
   forming an electrically isolating layer on an internal surface of each of said trenches;
   filling each of said trenches with a semiconductive or electrically conductive material up to an upper surface of the active region so as to form respective vertical gates of the triple-gate MOS transistor on opposite sides of the channel;
   forming a further electrically isolating layer on the upper surface of the area of the active region at the channel of the triple-gate MOS transistor;
   depositing at least one semiconductive or electrically conductive material on the further electrically isolating layer so as to form a horizontal gate of the triple-gate MOS transistor; and
   forming the non-volatile memory cell including a vertical gate transistor in the semiconductor substrate, wherein forming the non-volatile memory cell comprises:
      etching a trench in an active region of the semiconductor substrate for the vertical gate, forming an electrically isolating layer on an internal surface of said trench and filling said trench with a semiconductive or electrically conductive material up to an upper surface of the active region;
      wherein each of said etching, forming and filling steps for the vertical gate transistor are implemented simultaneously with the etching, forming and filling steps for the respective vertical gates of the triple-gate MOS transistor.

2. The method according to claim 1, wherein the respective vertical gates and the horizontal gate are electrically isolated from each other.

3. The method according to claim 1, wherein each of the electrically isolating layer and the further electrically isolating layer is a silicon oxide layer.

4. The method according to claim 1, wherein the semiconductive material forming each of the vertical gates is polycrystalline silicon.

5. The method according to claim 1, further comprising doping regions of the active region arranged on either side of the channel to form a source and a drain of the triple-gate MOS transistor.

6. A method for manufacturing a triple-gate MOS transistor, comprising:
   etching trenches on either side of an area of an active region in a semiconductor substrate that is laterally surrounded by electrically isolating regions in order to form a channel of the triple-gate MOS transistor in the semiconductor substrate;
   forming an electrically isolating layer on an internal surface of each of said trenches;
   filling each of said trenches with a semiconductive or electrically conductive material up to an upper surface of the active region so as to form respective vertical gates of the triple-gate MOS transistor on opposite sides of the channel;
   forming a further electrically isolating layer on the upper surface of the area of the active region at the channel of the triple-gate MOS transistor; and
   depositing at least one semiconductive or electrically conductive material on the further electrically isolating layer so as to form a horizontal gate of the triple-gate MOS transistor;

wherein forming the horizontal gate comprises successively depositing a first polycrystalline silicon layer, an oxide-nitride-oxide stack and a second polycrystalline silicon layer.

7. The method according to claim 6, wherein the respective vertical gates and the horizontal gate are electrically isolated from each other.

8. The method according to claim 6, wherein each of the electrically isolating layer and the further electrically isolating layer is a silicon oxide layer.

9. The method according to claim 6, wherein the semiconductive material forming each of the vertical gates is polycrystalline silicon.

10. The method according to claim 6, further comprising doping regions of the active region arranged on either side of the channel to form a source and a drain of the triple-gate MOS transistor.

11. A method for manufacturing a triple-gate MOS transistor, comprising:
    forming a pair of electrically isolating regions in a semiconductor substrate, wherein a portion of the semiconductor substrate is located between a first electrically isolating region and a second electrically isolating region of said pair of electrically isolating regions;
    etching a pair of trenches into and extending through the pair of electrically isolating regions, wherein said portion of the semiconductor substrate is located between a first trench and a second trench of said pair of trenches;
    forming an electrically isolating layer on an internal surface of each of said first trench and second trench of said pair of trenches;
    filling each of said first trench and second trench of said pair of trenches with a semiconductive or electrically conductive material fill, wherein said semiconductive or electrically conductive material fill forms respective first and second vertical gates of the triple-gate MOS transistor on opposite sides of the portion of the semiconductor substrate;
    forming a further electrically isolating layer on an upper surface of the portion of the semiconductor substrate; and
    depositing a semiconductive or electrically conductive material layer on the further electrically isolating layer, wherein said semiconductive or electrically conductive material layer forms a horizontal gate of the triple-gate MOS transistor over the portion of the semiconductor substrate.

12. The method of claim 11, wherein each of the electrically isolating layer and the further electrically isolating layer is a silicon oxide layer.

13. The method according to claim 11, wherein the semiconductive or electrically conductive material fill is polycrystalline silicon and wherein the semiconductive or electrically conductive material layer is polycrystalline silicon.

14. The method according to claim 11, further comprising doping regions of the semiconductor substrate to form a source of the triple-gate MOS transistor and a drain of the triple-gate MOS transistor.

15. The method according to claim 11, wherein depositing the semiconductive or electrically conductive material layer comprises:
    depositing a first polycrystalline silicon layer on the further electrically isolating layer;
    depositing an oxide-nitride-oxide stack on the first polycrystalline silicon layer; and
    depositing a second polycrystalline silicon layer on the oxide-nitride-oxide stack.

16. A method for manufacturing both a triple-gate MOS transistor and a vertical gate transistor, comprising:
    etching a plurality of trenches in a semiconductor substrate, said plurality of trenches including a pair of trenches in a first substrate area, wherein a portion of the semiconductor substrate is located between a first trench and a second trench of said pair of trenches, and said plurality of trenches including a further trench in a second substrate area;
    forming an electrically isolating layer on an internal surface of each trench of said plurality of trenches;
    filling each trench of said plurality of trenches with a semiconductive or electrically conductive material fill;
    wherein said semiconductive or electrically conductive material fill in the pair of trenches forms respective first and second vertical gates of the triple-gate MOS transistor on opposite sides of the portion of the semiconductor substrate;
    wherein said semiconductive or electrically conductive material fill in the further trench forms a vertical gate of the vertical gate transistor;
    forming a further electrically isolating layer on an upper surface of the semiconductor substrate; and
    depositing a semiconductive or electrically conductive material layer on the further electrically isolating layer over the portion of the semiconductor substrate in the first area, wherein said semiconductive or electrically conductive material layer forms a horizontal gate of the triple-gate MOS transistor over the portion of the semiconductor substrate.

17. The method of claim 16, wherein said semiconductive or electrically conductive material layer is further deposited on the further electrically isolating layer in the second area to form a further horizontal gate.

* * * * *